(12) United States Patent
Biloiu et al.

(10) Patent No.: US 9,060,411 B2
(45) Date of Patent: Jun. 16, 2015

(54) HARDWARE PLASMA INTERLOCK SYSTEM

(71) Applicant: Varian Semiconductor Equipment Associates, Inc., Gloucester, MA (US)

(72) Inventors: Costel Biloiu, Rockport, MA (US); Alexander Soskov, Danvers, MA (US); Chris Leavitt, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 280 days.

(21) Appl. No.: 13/804,496

(22) Filed: Mar. 14, 2013

(65) Prior Publication Data

US 2014/0265849 A1 Sep. 18, 2014

(51) Int. Cl.
*H05B 31/26* (2006.01)
*H05H 1/46* (2006.01)
*H01J 37/32* (2006.01)

(52) U.S. Cl.
CPC ......... *H05H 1/46* (2013.01); *H05H 2001/4682* (2013.01); *H01J 37/32174* (2013.01); *H01J 37/32412* (2013.01); *H01J 37/3299* (2013.01)

(58) Field of Classification Search
CPC . H05B 31/26; H05H 1/46; H05H 2001/4682; H01J 37/32174; H01J 37/32412; H01J 37/3299
USPC ............. 315/111.21, 111.41, 111.71, 111.81, 315/111.91
See application file for complete search history.

(56) References Cited

U.S. PATENT DOCUMENTS 8,395,322 B2 * 3/2013 Coumou .................. 315/111.21

* cited by examiner

Primary Examiner — Hai L Nguyen

(57) ABSTRACT

A hardware interlock system for monitoring operation of RF plasma sources. The hardware interlock system includes an RF generator operative to transmit a forward RF power used to generate plasma in a plasma chamber. A derivative based hardware interlock circuit is coupled in series with the RF generator. The derivative based hardware interlock circuit determines a reflected RF power derivative value indicative of the speed of change in reflected RF power values in the RF plasma ion source. An analog/digital (A/D) logic circuit is coupled with the derivative based hardware interlock circuit. The A/D logic circuit can shut down the RF generator output when the reflected RF power derivative value exceeds a threshold.

19 Claims, 5 Drawing Sheets

400

600

HARDWARE PLASMA INTERLOCK SYSTEM

BACKGROUND OF THE INVENTION

1. Field

Embodiments of the invention relate to the field of semiconductor device fabrication. More particularly, the present invention relates to a hardware plasma interlock system to protect an RF generator from potentially harmful effects that may occur during a plasma failure in an RF generated plasma system.

2. Background

Plasmas are used in a variety of ways in semiconductor processing to implant wafers or substrates with various dopants, to deposit or to etch thin films. Such processes involve the directional deposition or doping of ions on or beneath the surface of a target substrate. Other processes include plasma etching where the directionality of the etching species determines the aspect ratio and the quality of the trenches to be etched.

Plasmas are generated by supplying energy typically from an RF generator device to a neutral gas at low pressure. The ions that are generated by ionization processes in the plasma are implanted into the target substrate. For example, plasma doping (PLAD) systems are typically used when shallow junctions are required in the manufacture of semiconductor devices where lower ion implant energies confine the dopant ions near the surface of the wafer. In these situations, the depth of implantation is related to the bias voltage applied to the wafer. In particular, a wafer is positioned on a platen, which is biased at a negative potential with respect to the grounded plasma chamber. A gas containing the desired dopant materials is introduced into the plasma chamber. Plasma is generated by ionizing the gas atoms and/or molecules.

Once the plasma is generated, a plasma sheath forms between the plasma and the surrounding surfaces, including the workpiece. The sheath is essentially a thin layer at the boundary of the plasma which has a greater density of positive ions (i.e. excess positive charge) as compared to the bulk plasma which is electrically neutral. The platen and substrate (e.g., wafer for doping applications) are then biased with a negative voltage in order to cause the ions from the plasma to cross the plasma sheath. During crossing of the sheath, the ions acquire a kinetic energy equal with the potential drop across the sheath. The ions are implanted into the wafer at a depth proportional to the applied bias voltage. The ion dose implanted into the wafer and the dopant depth profile determines the electrical characteristics of the implanted region and the uniformity of the dose across the wafer surface ensures that all devices on the semiconductor wafer have identical operating characteristics within specified limits. Each of these parameters are critical in the semiconductor fabrication process to ensure that all devices have the desired operating characteristics.

Another approach is to generate plasma in a plasma chamber by coupling RF power from an RF generator to the working gas through an RF antenna. The antenna may be external to the plasma chamber with a dielectric window (alumina, quartz, sapphire, aluminum nitride) that serves as a transferring medium for the electromagnetic radiation generated by the antenna. The working gas is brought into the plasma chamber through gas inlets whereas vacuum pumping is accomplished through an extraction slit that also serves as an ion beam extraction path. The plasma chamber is held at a positive potential and the platen upon which a wafer or target substrate is disposed is at ground potential. In this manner, ions are extracted and the energy which they are implanted into the wafer is given by the potential difference between the plasma source chamber and the ground potential. By adjusting the RF power level and the working gas pressure (e.g. by adjusting the gas flow rate) the extracted ion beam current and its composition can be modified.

During operation of an RF plasma source generator, the plasma in a plasma chamber may be extinguished due to external causes such as, for example, extraction glitch, too low pressure, lack of gas, etc. An extraction glitch may be characterized as a sudden transient in the ion beam current. These glitches may cause unstable ion source operation and ion extraction thereby compromising the desired beam profile that negatively impacts manufacturing throughput. Similarly, too low of a pressure in the RF plasma chamber or a lack of working gas to be ionized may also result in unstable ion source operation and ion beam extraction. Under these circumstances, RF voltage levels on the antenna and RF circuitry may rise leading to undesired electrical arcs followed by matching network and/or RF plasma source generator electronics failure(s) or even fire.

In the absence of plasma, the RF power that would otherwise be transmitted to the gas molecules as ionization or excitation energy, now returns to the RF plasma source generator as reflected RF power. To prevent RF generator failure, fault protection circuitries (e.g., interlocks) that are part of the RF generator electronics are set to shut down the RF power output when reflected RF power exceeds a certain percentage of the forward power (e.g., >20%). The forward power is the power sent by the RF generator through the RF antenna to the load, i.e., plasma.

Various plasma monitoring methods have been proposed to initiate RF plasma source shut-down when abnormal RF operation is observed. Some of these monitoring methods include optical detectors, microwave injection-detection systems, and matching network capacitor tuning utilizing monitoring software algorithms. Unfortunately, these methods are less than ideal since they are either: too complicated, too slow in the response time, or not fully reliable.

For example, in RF driven plasma sources the power from an RF generator is coupled into the plasma by a matching network unit whose role may be to adapt a 50Ω output impedance of the RF generator to the variable plasma impedance level. The most common type of matching network, the so-called L-type configuration, comprises two variable capacitors (10-2000 pF), a tuning capacitor (CT) and a loading capacitor (CL) connected in series and respectively in parallel with the RF antenna in the case of inductively coupled plasma (ICP) or the powered electrode in the case of capacitively coupled plasma (CCP). Three elements Π-type and T-type matching networks are wide band matching networks and make possible matching for almost any type of load.

In a known plasma monitoring method, an electrical detector may be used to sense the amount of reflected RF power. Based on minimization algorithms, two motors drive a variable tuning and a variable loading capacitor to certain values of capacitance designed to achieve a global minimum in the reflected RF power (maximize transmitted power to the load). In other words, the capacitance values of the capacitors in the matching network are adjusted so that the overall impedance of the load and the matching network is 50Ω. Being mechanically driven, the response time of such a feedback system is relatively slow (typically a few seconds) when compared with response times of purely electrical signals.

In another known plasma monitoring method, the plasma state is monitored using an optical detector such as a photodiode. As long as the plasma is present, excited atoms and molecules in the plasma will emit photons and the emitted light can be used as an indicator of plasma presence. Although faster than the mechanical adjustment of capacitors method, the optical detector method is slower than a reflected RF power derivative method because it requires an additional step that involves control system software that adds ~250 ms to the response time. In addition, the optical detector method is much more complicated. It utilizes additional hardware (e.g., photodiode, windows, electronic filters) and imposes additional limitations (e.g., the necessity of a transparent window, prevention of window coating, limited photodiode lifetime, RF noise picked-up by the photodiode preamplifier, etc.) to the plasma monitoring method.

Another plasma monitoring method is based on microwave detection. Although the microwave detection method solves the window coating problem mentioned above, it requires a microwave generator, an antenna emitter and a microwave detector. Each of these components is difficult to implement on/in a production tool. Moreover, both the microwave and optical methods require a control system software stage to analyze the signal and then send an RF power shut down command to the RF plasma source generator to shut down the output of the RF plasma source generator. As earlier stated, the control system software stage can add ~250 ms to the response time.

SUMMARY

The embodiments disclosed and claimed herein are an improvement to the art and describe a system and method that provide a simple, reliable, robust and faster method to detect RF plasma failures and prevent hardware damage to an RF plasma ion source because of such plasma failures.

In an embodiment, a hardware interlock system for monitoring plasma includes an RF generator operative to transmit a forward RF power used to generate plasma in a plasma chamber. A derivative based hardware interlock circuit is coupled in series with the RF plasma generator. The derivative based hardware interlock circuit determines a reflected RF power derivative value indicative of a speed of change in reflected RF power in the RF plasma ion source circuitry. An analog/digital (A/D) logic circuit is coupled with the derivative based hardware interlock circuit. The A/D logic circuit can shut down the RF generator when the reflected RF power value exceeds a preset threshold.

In another embodiment, a derivative based hardware interlock circuit is disclosed that can determine a reflected RF power derivative value indicative of speed of change in reflected RF power in an RF plasma ion source. The derivative based hardware interlock circuit includes a bandpass filter configured to receive the reflected RF power and RF driving frequency as inputs and generate a reflected RF power derivative value as an output. A comparator can compare the reflected RF power derivative value to an integrated RF power reference value received from a slope dependent filter and output a detected overshoot value. The overshoot value can be fed to an analog/digital (A/D) circuit that can shut down the RF generator output when the value of the derivative of the reflected RF power exceeds a preset threshold value.

In another embodiment, a plasma monitoring method implemented using hardware components exclusively is described. The method determines a reflected RF power derivative value indicative of a change in reflected RF power in an RF plasma ion source. The method then compares the reflected RF power derivative value to a pre-determined reference value. The method then opens a circuit causing the RF generator to shut down its output when the reflected RF power derivative value exceeds the pre-determined reference value.

DESCRIPTION OF EMBODIMENTS

Figure 1:
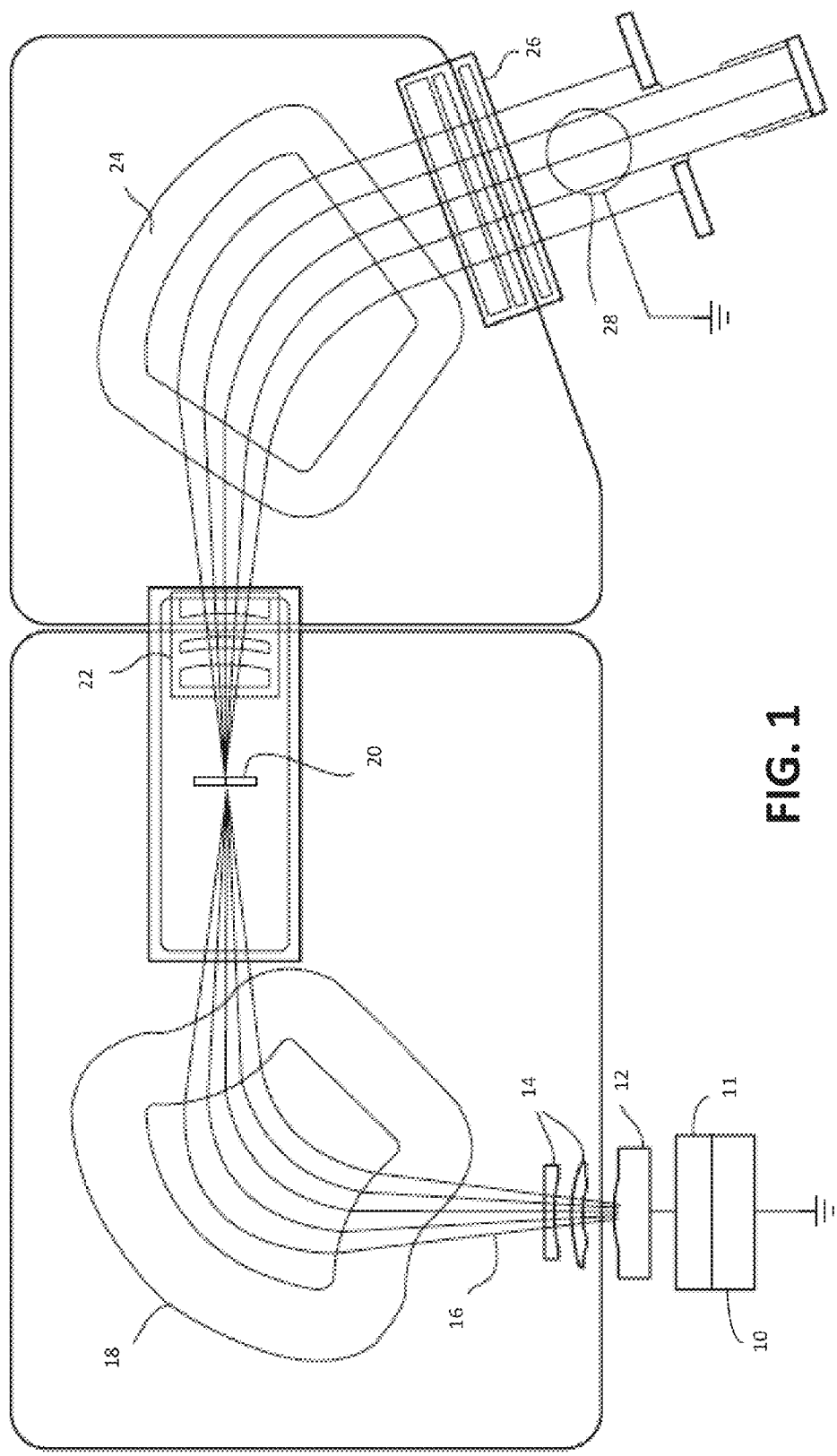
FIG. 1 is a block diagram of an example ion implanter system.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a block diagram of an exemplary ion implanter system including an RF generator 10 and a matching network 11 that supply the required energy to the working gas in the plasma chamber 12 to generate ions of a particular species. The generated ions are extracted from the ion source through a series of electrodes 14 (i.e. extraction optics) and formed into a beam 16 which passes through a mass analyzer magnet 18. The mass analyzer magnet 18 is configured with a particular magnetic field such that only the ions with a desired mass-to-charge ratio are able to travel through the analyzer magnet and pass through the mass resolving slit 20. Ions of the desired species pass from mass slit 20 through deceleration stage 22 to corrector magnet 24. Corrector magnet 24 is energized to deflect ion beamlets in accordance with the strength and direction of the applied magnetic field to provide a ribbon beam targeted toward a work piece or substrate positioned on support (e.g. platen) 28. In some embodiments, a second deceleration stage 26 may be disposed between corrector magnet 24 and support 28. The ions lose energy when they collide with electrons and nuclei in the substrate and come to rest at a desired depth within the substrate based on the acceleration energy.

Figure 2:
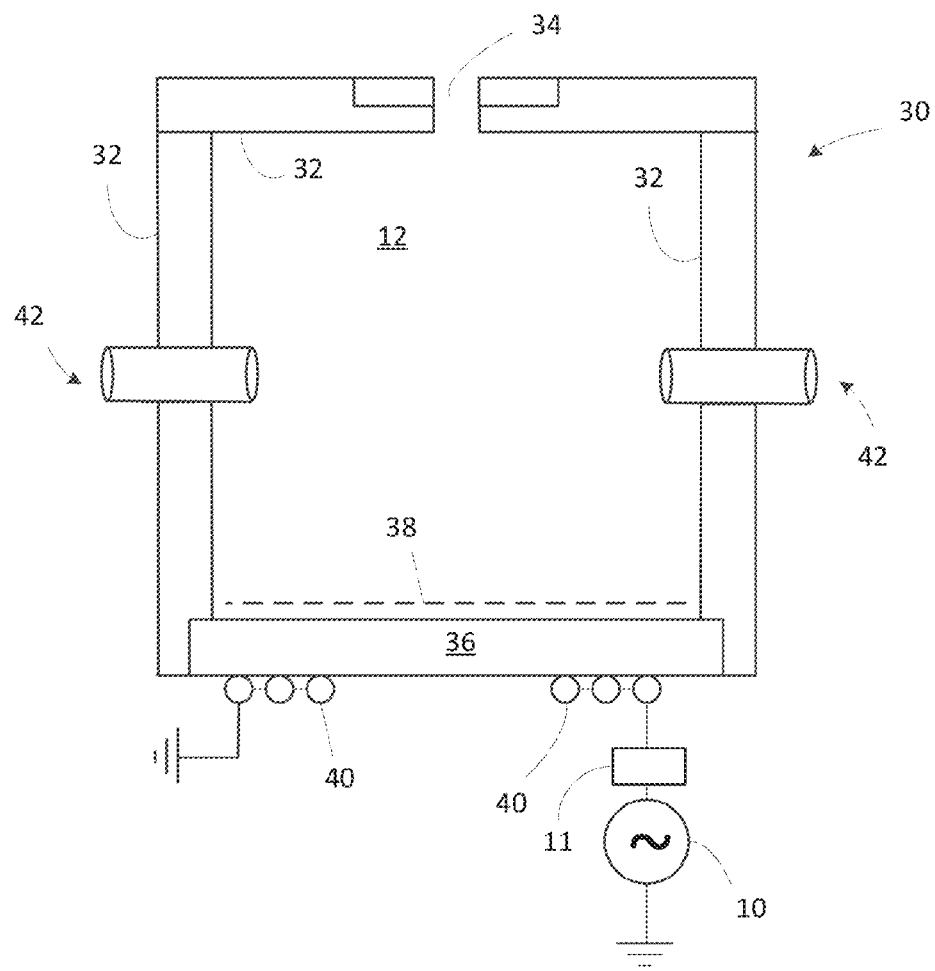
FIG. 2 illustrates a cross-sectional block diagram of one example of an RF plasma ion source.

FIG. 2 illustrates a cross-sectional block diagram of one example of an RF plasma ion source 30. A plasma chamber 12 is defined by walls 32 that are sealed by a dielectric window 36 to create a volume. Vacuum pumping is accomplished through a slit 34 by a pumping system (not shown) comprised of turbomolecular pumps backed by roughing pumps. Slit 34 also serves for the extraction of the ion beam. Gas feed-through openings 42 in walls 32 allow the working gas to be continuously introduced into the plasma chamber 12 to maintain the plasma and replenish the consumed gas and continuously generate ions. The gas by-products following plasma decomposition are continuously pumped out through slit 34. The working gas may be, for example, $BF_3$, $B_2H_6$, $PF_3$, $PH_3$, $GeF_4$, $AsF_3$ etc., depending on the desired dopant nature.

Inside the plasma chamber and in front of the dielectric window 36 (corresponding to the vacuum side) is a Faraday shield 38 that runs perpendicular to an antenna array 40 positioned on the atmospheric pressure side of the dielectric window 36. Faraday shield 38 is configured to decrease the capacitive coupling of the antenna to the plasma. The antenna array 40 is driven by an RF generator 10 through matching network 11. The RF system (RF generator 10, RF matching network 11, and antenna 40) is designed to typically operate in the frequency range of 0.4 MHz-160 MHz. According to Maxwell's $3^{rd}$ law, the variable magnetic field (B) generated by the RF current ($I_{rf}$) through the antenna array 40 induces a local electric field (E) in the plasma chamber.

$$\nabla \times \vec{E} = -\partial \vec{B}/\partial t \tag{1}$$

As a result the free electrons gain kinetic energy and are able to ionize working gas atoms and/or molecules through ionization collisions.

As stated above, in the absence of plasma, the RF power that would otherwise be transmitted to the electrons and then to gas molecules as ionization or excitation energy, now returns to the RF generator as reflected RF power. Under these circumstances, higher RF voltages may develop into the RF plasma ion source circuitry. This abnormal operation may result in arcing, fire and/or RF generator damage. To prevent failure of RF generator 10, fault protection circuitries (e.g., interlocks) that are part of the RF generator electronics are set to shut down the RF power output when reflected RF power exceeds a certain percentage of the forward power (e.g., >20%).

The plasma monitoring methods described earlier (e.g., optical detector and microwave detection) are based on detecting the presence of the plasma. The reflected RF power method is based on monitoring the level of the reflected power. If no plasma presence or high reflected RF power is detected, an RF power shut down command is sent to the RF generator to shut down the output of the RF generator. Each of the aforementioned plasma monitoring methods suffers from one or more drawbacks pertaining to response time, complexity, and reliability.

In the embodiments presented herein, a plasma monitoring method utilizes the derivative of the reflected RF power. The derivative reflected RF power plasma monitoring system can be implemented using hardware components (e.g., electronic circuitry) to calculate a derivative of the reflected RF power signal. The reflected RF power derivative circuitry can be introduced in an analog digital input output (ADIO) controller coupled with or within the RF plasma ion source circuitry that acts as a hardware interlock. By eliminating the need for software evaluation of reflected RF power measurements, the derivative reflected RF power plasma monitoring system improves the detection time of abnormal operation and improves reliability of an RF hardware interlocking system.

Figure 3:
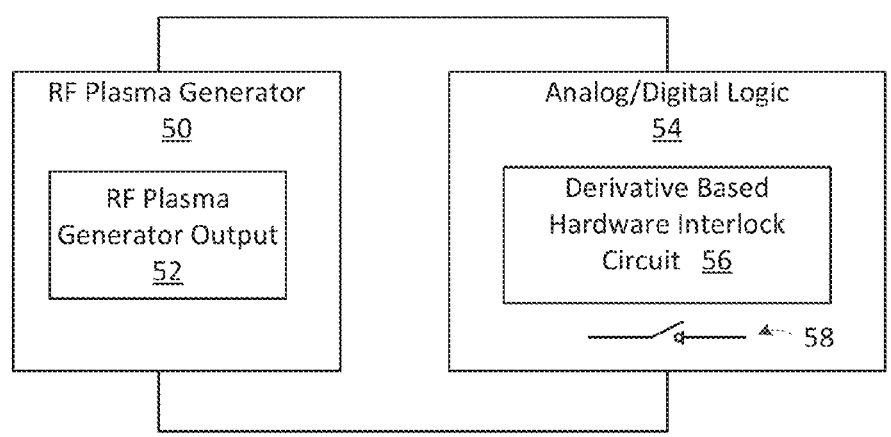
FIG. 3 illustrates a block diagram of an embodiment of a hardware interlock system.

FIG. 3 illustrates a block diagram of an embodiment of a hardware interlock system. An RF plasma ion source circuitry includes an RF generator 50 having an output stage 52 that transmits RF power via a load balancing matching network into plasma contained within a plasma chamber. The RF generator 50 and implicitly the RF generator output stage 52 are electrically coupled with an analog/digital (A/D) logic circuit 54 associated with or situated within the RF plasma ion source circuitry. The electrical coupling is in serial such that a closed circuit is formed between the A/D logic circuit 54 and the RF generator output stage 50. If this circuit is interrupted or opened, the RF generator output portion 50 will cease to operate. The remainder of the RF generator 50 may remain operational and powered up but it will be unable to output any RF power RF while the circuit is open.

The A/D logic circuit 54 is coupled with a derivative based hardware interlock circuit 56. The derivative based hardware interlock circuit 56 is operative to monitor the forward and reflected RF power levels of the RF generator 50. The derivative based hardware interlock circuit 56 can convert these measurements to a derivative value for the reflected RF power. The derivative value for the reflected RF power is different than the actual value for the reflected RF power because it is a measurement of the change in reflected RF power over a time period not the actual reflected RF power itself. Changes in reflected RF power may indicate failure conditions more accurately than actual reflected RF power measurements because the derivative value is indicative of a change that may be the result of an imminent plasma failure even if the actual reflected RF power values have not yet crossed a threshold. Thus, protective measures may be taken before conditions reach a certain point for an actual reflected RF power value because the hardware detection interlock circuit is based on a rapid detected change in reflected RF power.

The A/D 56 logic circuit 54 may also include a switch 58 that can be opened if a threshold condition is detected. Opening the switch 58 breaks the circuit and shuts power down to the RF generator output stage 52 of the RF generator 50.

Figure 4:
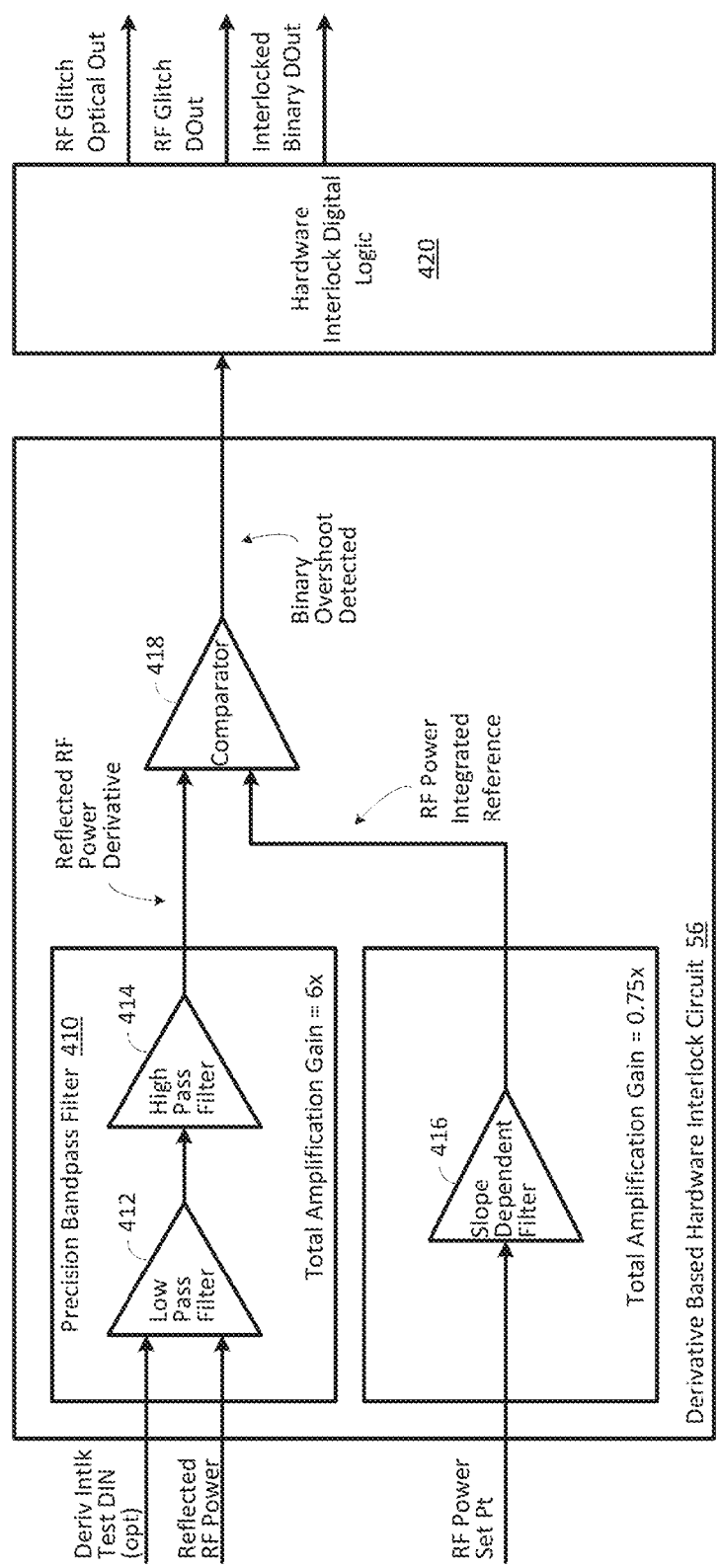
FIG. 4 illustrates a more detailed block diagram of certain components of the hardware interlock system.

FIG. 4 illustrates a more detailed block diagram 400 of certain components of the derivative based hardware interlock circuit 56. The derivative based hardware interlock circuit 56 is comprised of a precision bandpass filter 410 that receives a reflected RF power value into a low pass filter 412 whose output is fed to a high pass filter 414. The low pass filter 412 may be tuned to at least 300 Hz to filter out useless noise signals above that frequency. This first stage low pass filter 412 filters out RF noise to avoid overloading the following filter stages. The high pass filter 414 may be tuned to no less than 2.75 Hz to avoid false interlocking False interlocking is a condition where the circuit could falsely detect a plasma failure and shut down the RF generator output 52 unnecessarily. The total amplification gain of the precision bandpass filter 410 is 6× to allow for the forming of an overshoot pulse by a comparator 418.

In one embodiment, the combination of the low pass filter 412 and high pass filter 414 create an acceptable bandwidth of between 2.75 Hz and 300 Hz. All other frequencies are filtered out. In other embodiments, the low pass filter may range between 300 Hz and 1 KHz while the high pass filter may range between 2.75 Hz and 5 Hz. The filter values have been determined based on observations that slow variations in reflected RF power do not correspond to RF power failures while fast variations of reflected RF power are related to faults and can lead to damage of expensive components inside the RF plasma ion source circuitry. It should be noted that there may be additional filter stages between the low pass filter 412 and the high pass filter 414.

The output of the high pass filter 414 is indicative of a derivative for the input reflected RF power. The reflected RF power derivative value is input to the comparator 418 along with an integrated RF power reference value. The integrated RF power reference value is the output of a slope dependent filter 416 that receives an RF power set point as input. The slope dependent filter 416 helps avoid false interlocking. For instance, the comparator 418 is constantly monitoring a fast derivative value. Because of a slow integrated reference value, the RF power may be interlocked by mistake in case of intentionally changing the RF power if commanded by an external control system (not shown). To avoid false interlocking, the filter slew rate on front edge is much faster than slew rate on falling edge for the slope dependent filter 416. Thus, when a control system commands a rise in forward RF power, the voltage provided to comparator 418 for the reference value rises up immediately. The rise is almost as fast as the voltage spike on the derivative for the input reflected RF power. Then, when forward RF power is commanded by an external control system to decrease, the reference voltage decreases very slowly making false interlocking less possible.

While not shown, additional hardware circuitry may be included in the path of the integrated RF power reference signal to disable the derivative based hardware interlock circuit 56 when RF power is very low (about 100 W). This is because fast interlocking is not required when low power cannot damage RF components in the RF power supply system.

If the comparator 418 detects that the reflected RF power derivative is indicative of a binary overshoot of the integrated RF power reference value (e.g., >20% of the RF Power set point), comparator 418 will send a signal to a hardware interlock digital circuit 420 to shut down the RF generator output 52. The hardware interlock digital circuit 420 may be a part of the A/D logic circuit 54. Thus, when the reflected RF power derivative overshoot exceeds the pre-determined threshold of forwarded RF power, the derivative based hardware interlock circuit 56 triggers the hardware interlock digital circuit 420 and forward RF power is cut to the RF plasma generator output 52.

Existing control systems exhibit two main problems when configured as an interlocking system. First, they are not fast enough and second, they can be bypassed by a user. The first problem can result in hardware damage and the second problem is not acceptable under safety considerations. The hardware interlock digital circuit 420 (typically located on an application PCB) is not under control system control in normal operation. The hardware interlock digital circuit 420 can shut off the forward RF power supply very fast via a hardware only mechanism. The hardware interlock digital circuit 420 outputs (RF Glitch Optical Out, RF Glitch DOut, Interlocked Binary DOut) inform the control system what was responsible for shutting down the RF plasma generator output and why after the shutdown occurs.

Figure 5:
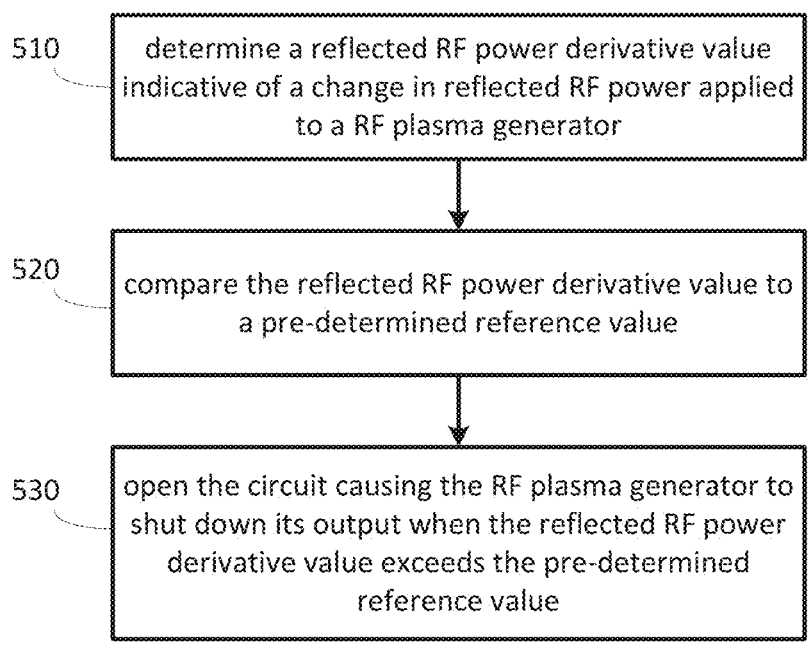
FIG. 5 illustrates one embodiment of a logic flow diagram.

FIG. 5 illustrates one embodiment of a logic flow 500. Logic flow 500 may be representative of the operations executed by one or more embodiments described herein.

The logic flow 500 may determine a reflected RF power derivative value indicative of a change in reflected RF power of an RF generator at block 510. For example, the derivative based hardware interlock circuit 405 may receive an actual reflected RF power value and convert it to a derivative reflected RF power value using the precision bandpass filter 410 shown in FIG. 4.

The logic flow 500 may compare the reflected RF power derivative value to a pre-determined integrated reference value at block 520. For example, a comparator 418 may receive the derivative reflected RF power value and a pre-determined RF power integrated reference value from the slope dependent filter 416 and provide an output indicative of the difference between the inputs. The output may be characterized as the detected binary overshoot.

The logic flow 500 may open a circuit causing the RF plasma generator to shut down its output at block 530. For example, the comparator 418 is fed to the hardware interlock digital logic 420. When the comparator 418 output indicates a detected binary overshoot value above a threshold value (e.g., >20% of forward RF power), the hardware interlock digital logic component 420 causes the switch 56 to open. The open switch 56 prevents forward RF power to the RF generator output stage 50 of the RF generator 10. With the power cut-off, damage to the RF plasma generator 10 can be avoided.

The embodiments described above have been tested and proven effective in detecting and responding to a plasma failure in a plasma generating system such as those used in ion implantation systems.

Figure 6:
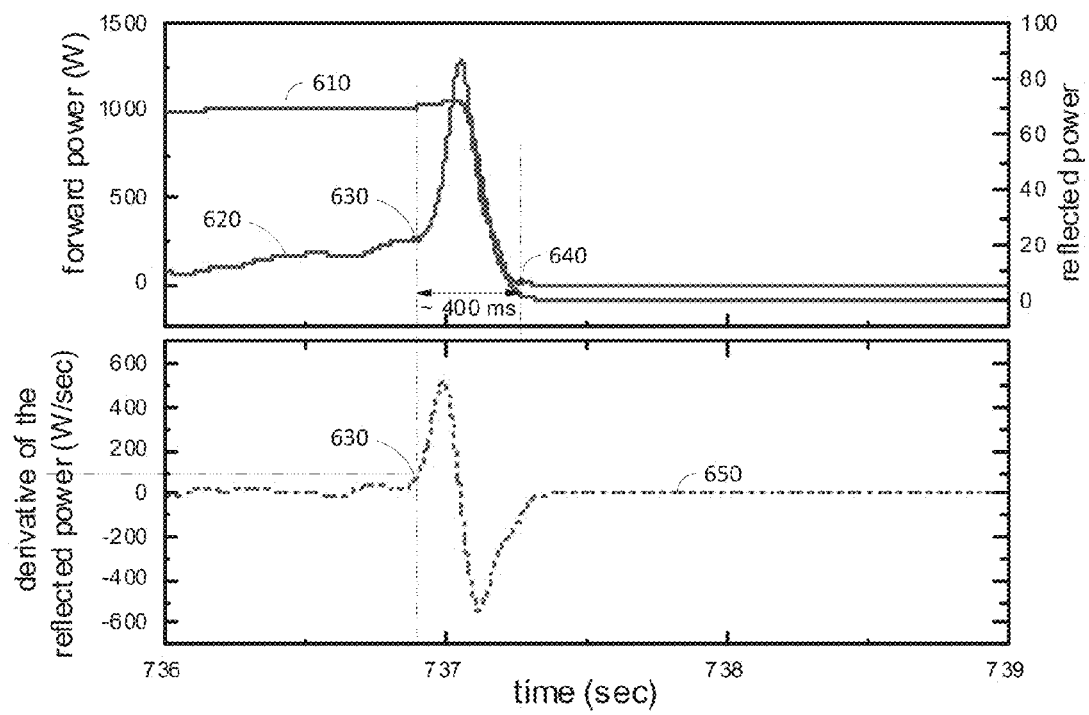
FIG. 6 shows two graphs illustrating the performance of an embodiment of a derivative power based hardware interlock system.

FIG. 6 shows two graphs 600 illustrating the performance of an embodiment of a derivative power based hardware interlock system. The hardware interlock system embodiments described herein were tested in a simulated accident in which plasma was ignited in a plasma chamber and then the gas flow for creating and sustaining the plasma was cut off. The plasma generating system was monitored to determine the response time from plasma failure to RF power shut down. This may be characterized as the forward power RF power shut down time. As the graph in FIG. 6 illustrates, the response time was approximately 400 ms. The forward power is represented by graph 610 while the reflected RF power is represented by graph 620. The normal operating forward power is approximately 1000 watts according to the y-axis (left side) of the graph. The trigger point 630 on the derivative of the reflected RF power (bottom graph 650) indicates the point at which the derivative of the reflected RF power exceeds a threshold reference value hardwired into the circuitry. The RF malfunction is detected very early. For example, for this trigger point the reflected power value as indicated on the y-axis (right side) of the graph is very low (~22 W) which means ~2.2% of the forward power. However, the corresponding reflected power derivative value is relatively high, ~100 W/sec. The shutdown signal being sent so early the reflected RF power is reduced during shutdown process to ~80 W. The shutdown point 640 on the forward power graph 610 indicates the point at which the forward power has been cut off or severely curtailed so as to eliminate the reflected RF power. The time on the x-axis between the trigger point 630 and the shutdown point 640 was measured as approximately 400 ms.

Similar tests were executed using the capacitor position detection and adjustment method and the optical detection method. The results of those tests (not shown) exhibited significantly slower response times. For instance the capacitor position detection and adjustment method was extremely slow—on the order of three (3) seconds. This is more than seven (7) times slower than the reflected RF power derivative hardware interlock system described herein. The optical detection method took a full second (3½) times longer to detect and respond to the plasma failure. One second is enough time for the high RF voltage generated by the reflected RF power to burn electronic components in the RF plasma ion source circuitry.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A hardware interlock system for monitoring plasma comprising:

an RF generator configured to generate plasma in a plasma chamber having a forward RF power when a source gas is present in the plasma chamber;

a derivative based hardware interlock circuit coupled in series with the RF generator, the derivative based hardware interlock circuit operative to determine a derivative value of reflected RF power indicative of a speed of change in the reflected RF power in a RF plasma ion source circuitry; and a logic circuit coupled with the derivative based hardware interlock circuit operative to shut down an output of the RF generator when the reflected RF power derivative value exceeds a predetermined threshold.

2. The hardware interlock system of claim 1, wherein the derivative based hardware interlock circuit comprising:

a bandpass filter comprised of a low pass filter and a high pass filter, the bandpass filter operative to determine the reflected RF power derivative value;

a slope dependent filter operative to output an integrated RF power reference value; and a comparator operative to compare the reflected RF power derivative value to the integrated RF power reference value and output a detected overshoot value.

3. The hardware interlock system of claim 2, wherein the low pass filter operative to reject signals above 300 Hz.

4. The hardware interlock system of claim 2, wherein the high pass filter operative to reject signals below 5 Hz.

5. The hardware interlock system of claim 2, wherein the logic circuit is operative to shut down the RF generator output when the detected overshoot value exceeds a pre-determined threshold value.

6. The hardware interlock system of claim 5, wherein the pre-determined threshold value is set at no more than 20% of the forward RF power generated by the RF generator.

7. The hardware interlock system of claim 5, wherein the pre-determined threshold value is set at between 20% and 30% inclusive of the forward RF power generated by the RF generator.

8. The hardware interlock system of claim 5, wherein the threshold value set at between 20% and 30% inclusive of the forward RF power generated by the RF generator.

9. A derivative based hardware interlock circuit operative to determine a reflected RF power derivative value indicative of a change in reflected RF power applied to an RF generator generating an RF plasma having a forward RF power, the derivative based hardware interlock circuit comprising:

a bandpass filter receiving the reflected RF power as input and generating a reflected RF power derivative value as output; and a comparator operative to compare the reflected RF power derivative value to an integrated RF power reference value received from a slope dependent filter and output a detected overshoot value.

10. The derivative based hardware interlock circuit of claim 9, wherein the bandpass filter comprised of a low pass filter coupled to a high pass filter.

11. The derivative based hardware interlock circuit of claim 10, wherein the low pass filter operative to reject signals above 300 Hz.

12. The derivative based hardware interlock circuit of claim 10, wherein the high pass filter operative to reject signals below 5 Hz.

13. The derivative based hardware interlock circuit of claim 9, wherein the derivative based hardware interlock circuit electrically coupled in series with the RF generator.

14. The derivative based hardware interlock circuit of claim 13, wherein the derivative based hardware interlock circuit electrically coupled with an analog/digital (A/D) circuit operative to shut down the RF generator when the reflected RF power derivative value exceeds a threshold value.

15. The derivative based hardware interlock circuit of claim 14, wherein the threshold value set at no more than 20% of the forward RF power generated by the RF generator.

16. A plasma monitoring method implemented by a hardware interlock system, the method comprising:

determining a reflected RF power derivative value indicative of a change in reflected RF power of an RF generator generating a forward RF power;

comparing the reflected RF power derivative value to a pre-determined reference value; and opening a circuit causing the RF generator to shut down its output.

17. The plasma monitoring method of claim 16, wherein the opening occurring when the reflected RF power derivative value exceeds the pre-determined reference value.

18. The plasma monitoring method of claim 17, wherein the pre-determined reference value is set at no more than 20% of the forward RF power generated by the RF generator.

19. The plasma monitoring method of claim 17, wherein the threshold value set at between 20% and 30% inclusive of the forward RF power generated by the RF generator.

* * * * *